(12) United States Patent
Wang et al.

(10) Patent No.: US 11,087,111 B2
(45) Date of Patent: Aug. 10, 2021

(54) METHOD AND APPARATUS FOR FINGERPRINT COLLECTION

(71) Applicant: Shanghai Harvest Intelligence Technology Co., Ltd., Shanghai (CN)

(72) Inventors: Fei Wang, Shanghai (CN); Xueke Hu, Shanghai (CN); Tianyang Wang, Shanghai (CN); Sheng Feng, Shanghai (CN); Fengjun Gu, Shanghai (CN); Jiandong Huang, Shanghai (CN)

(73) Assignee: Shanghai Harvest Intelligence Technology Co., Ltd., Shanghai (CN)

( * ) Notice: Subject to any disclaimer, the term of this patent is extended or adjusted under 35 U.S.C. 154(b) by 0 days.

(21) Appl. No.: 16/696,387

(22) Filed: Nov. 26, 2019

(65) Prior Publication Data
US 2020/0167543 A1 May 28, 2020

(30) Foreign Application Priority Data
Nov. 27, 2018 (CN) .......................... 201811430177.X

(51) Int. Cl.
*G06K 9/00* (2006.01)
*H01L 27/32* (2006.01)
*G06F 3/041* (2006.01)

(52) U.S. Cl.
CPC ......... *G06K 9/0004* (2013.01); *G06F 3/0412* (2013.01); *G06K 9/00046* (2013.01); *H01L 27/323* (2013.01); *H01L 27/3234* (2013.01); *G06K 2009/0006* (2013.01)

(58) Field of Classification Search
CPC ............ G06K 9/0004; G06K 9/00046; G06K 2009/0006; G06F 3/0412; H01L 27/323; H01L 27/3234
See application file for complete search history.

(56) References Cited

U.S. PATENT DOCUMENTS

| | | | |
|---|---|---|---|
| 2006/0214892 A1* | 9/2006 | Harada | G06F 3/0412 345/81 |
| 2008/0055494 A1* | 3/2008 | Cernasov | G02F 1/13338 349/12 |
| 2008/0211787 A1* | 9/2008 | Nakao | G06F 3/042 345/175 |
| 2018/0151656 A1* | 5/2018 | Choo | G09G 3/3233 |

\* cited by examiner

*Primary Examiner* — Stephen G Sherman
(74) *Attorney, Agent, or Firm* — Harness, Dickey & Pierce, P.L.C.

(57) ABSTRACT

A method and an apparatus for fingerprint collection are provided. The method includes: lighting up pixels of a plurality of light source regions on a display panel according to a preset timing sequence, where each light source region includes one or more pixels, all the light source regions are simultaneously lighted up during a first time period and none of light source regions is lighted up during a second time period; controlling a photoelectric sensing module to collect first and second optical signals respectively in the first and second time periods, the first optical signal including a reflected light signal formed by reflecting, with a light-transmissive cover plate, light from the light source regions; correcting the collected first optical signal based on the second optical signal, where the display panel and the photoelectric sensing module are disposed at a same side of the light-transmissive cover plate.

20 Claims, 5 Drawing Sheets

Light up pixels of a plurality of light source regions on a display panel according to a preset timing sequence, where each of the light source regions includes one or more pixels on the display panel, all the multiple light source regions are simultaneously lighted up during a first time period and none of the multiple light source regions is lighted up during a second time period — S11

Control a photoelectric sensing module to collect a first optical signal in the first time period and collect a second optical signal in the second time period, where the first optical signal includes a reflected light signal formed by reflecting, with a light-transmissive cover plate, light from the multiple light source regions — S13

Correct the collected first optical signal based on the second optical signal collected by the photoelectric sensing module — S15

METHOD AND APPARATUS FOR FINGERPRINT COLLECTION

CROSS-REFERENCE TO RELATED APPLICATIONS

The present application claims priority to Chinese patent application No. 201811430177.X, titled "METHOD AND APPARATUS FOR FINGERPRINT COLLECTION", filed on Nov. 27, 2018 with the China National Intellectual Property Administration, the disclosure of which is incorporated herein by reference in its entirety.

TECHNICAL FIELD

The present disclosure relates to the field of fingerprint recognition technology, and in particular, to a method and apparatus for fingerprint collection.

BACKGROUND

The fingerprint imaging recognition technology acquires a fingerprint image by transmitting a detection signal to a fingerprint through a transmission source, collecting a detection signal modulated by a fingerprint through a sensor, and performing data processing on the collected signal. Due to the uniqueness of human fingerprints, the fingerprint imaging recognition technology has been widely used in various fields, for example, security check, access control system, or unlocking of devices such as personal computers and mobile phones.

Fingerprint imaging recognition technology may be implemented in a variety of ways, such as optical imaging, capacitive imaging, or ultrasound imaging. Relatively speaking, the optical fingerprint imaging recognition technology is gradually becoming the mainstream technology due to its advantages of better performance, easier implementation, and lower cost.

In the optical fingerprint recognition technology, the presence of ambient light will bring a huge background signal to the collected fingerprint image, and thereby reduce the signal-to-noise ratio of the collected fingerprint data.

SUMMARY

In order to eliminate influence of ambient light and further improve a signal-to-noise ratio of the collected fingerprint image, the present disclosure provides a method for fingerprint collection, including:
lighting up pixels of a plurality of light source regions on a display panel according to a preset timing sequence, where each of the light source regions includes one or more pixels on the display panel, all the plurality of light source regions are simultaneously lighted up during a first time period and none of the plurality of light source regions is lighted up during a second time period; controlling a photoelectric sensing module to collect a first optical signal in the first time period and collect a second optical signal in the second time period, where the first optical signal includes a reflected light signal formed by reflecting, with a light-transmissive cover plate, light from the plurality of light source regions; and correcting the collected first optical signal based on the second optical signal collected by the photoelectric sensing module, where the display panel and the photoelectric sensing module are disposed at a same side of the light-transmissive cover plate.

In an embodiment, lighting up the pixels of the plurality of light source regions on the display panel according to the preset timing sequence includes: periodically lighting up pixels of each light source region according to the preset timing sequence, where a time interval between two adjacent lighting time instants of each light source region is a lighting period, the lighting period of each light source region includes a third time period in which the light source region emits light and a fourth time period in which the light source region does not emit light, the third time period includes the first time period, and the fourth time period includes the second time period.

In an embodiment, controlling the photoelectric sensing module to collect the first optical signal in the first time period and collect the second optical signal in the second time period includes: controlling the photoelectric sensing module to collect the first optical signal in the first time period of each lighting period of the light source region and collect the second optical signal in the second time period of each lighting period of the light source region.

In an embodiment, a time interval between two adjacent collection time instants of the first optical signal by the photoelectric sensing module is a collection period, each collection period at least includes the first time period and the second time period, and correcting the collected first optical signal based on the second optical signal collected by the photoelectric sensing module includes correcting the first optical signal collected by the photoelectric sensing module in each collection period based on the second optical signal collected by the photoelectric sensing module in the same collection period.

In an embodiment, the first time period accounts for 10% to 90% of the third time period, and the second time period accounts for 10% to 90% of the fourth time period.

In an embodiment, the ratio of the third time period to the fourth time period ranges from 1:1 to 5:1.

In an embodiment, a lighting frequency of the light source region ranges from 10 Hz to 60 Hz.

In an embodiment, correcting the first optical signal collected by the photoelectric sensing module in each collection period based on the second optical signal collected by the photoelectric sensing module in the same collection period includes: subtracting the second optical signal from the first optical signal by a differential method.

In an embodiment, the collection period of the photoelectric sensing module is equal to the lighting period of the light source region.

In an embodiment, the first time period and the second time period both range from 5 ms to 45 ms.

In an embodiment, the method for fingerprint collection further includes: performing positional shifting on the plurality of light source regions after a preset time interval; and re-performing the steps of lighting up the pixels of the plurality of light source regions, controlling the photoelectric sensing module to collect the first optical signal and the second optical signal and correcting the first optical signal based on the second optical signal.

Accordingly, the present disclosure further provides an apparatus for fingerprint collection, including: a light-transmissive cover plate having a surface for contact with a fingerprint; a display panel including a pixel array; a photoelectric sensing module configured to receive and detect an optical signal; a driving module, configured to: light up pixels of a plurality of light source regions on the display panel according to a preset timing sequence, where each light source region includes one or more pixels on the display panel, all the plurality of light source regions are simultaneously lighted up during a first time period and none of the plurality of light source regions is lighted up during a second time period; and control the photoelectric sensing module to collect a first optical signal in the first time period and collect a second optical signal in the second time period, where the first optical signal includes a reflected light signal formed by reflecting, with the light-transmissive cover plate, light from the plurality of light source regions; and a processing module configured to correct the collected first optical signal based on the second optical signal collected by the photoelectric sensing module, where the display panel and the photoelectric sensing module are disposed at a same side of the light-transmissive cover plate.

In an embodiment, the driving module is configured to periodically light up pixels of each light source region according to the preset timing sequence, where a time interval between two adjacent lighting time instants of each light source region is a lighting period, the lighting period of each light source region includes a third time period in which the light source region emits light and a fourth time period in which the light source region does not emit light, the third time period includes the first time period, and the fourth time period includes the second time period.

In an embodiment, the driving module is configured to control the photoelectric sensing module to collect the first optical signal in the first time period of each lighting period of the light source region and collect the second optical signal in the second time period of each lighting period of the light source region.

In an embodiment, a time interval between two adjacent collection time instants of the first optical signal by the photoelectric sensing module is a collection period, each collection period at least includes the first time period and the second time period, and the processing module is configured to correct the first optical signal collected by the photoelectric sensing module in each collection period based on the second optical signal collected by the photoelectric sensing module in the same collection period.

In an embodiment, the first time period accounts for 10% to 90% of the third time period, and the second time period accounts for 10% to 90% of the fourth time period.

In an embodiment, the ratio of the third time period to the fourth time period ranges from 1:1 to 5:1.

In an embodiment, a lighting frequency of the light source region ranges from 10 Hz to 60 Hz.

In an embodiment, the processing module corrects the first optical signal collected by the photoelectric sensing module in each collection period based on the second optical signal collected by the photoelectric sensing module in the same collection period includes: the processing module subtracts the second optical signal from the first optical signal by a differential method.

In an embodiment, the collection period of the photoelectric sensing module is equal to the lighting period of the light source region.

In an embodiment, the first time period and the second time period both range from 5 ms to 45 ms.

In an embodiment, the driving module is further configured to: perform positional shifting on the plurality of light source regions after a preset time interval; and re-perform the steps of lighting up the pixels of the plurality of light source regions and controlling the photoelectric sensing module to collect the first optical signal and the second optical signal; and the processing module is further configured to correct the first optical signal collected by the photoelectric sensing module based on the second optical signal collected by the photoelectric sensing module after positions of the plurality of light source regions are shifted.

Compared with the conventional technology, the technical solutions of the present disclosure have the following beneficial effects.

According to the method and apparatus for fingerprint collection, in the first time period in which all the light source regions of the display panel are lighted up, the first optical signal is collected by the photoelectric sensing module, and the first optical signal includes not only reflected light signal formed by reflecting, with the light-transmissive cover plate, light from the plurality of light source regions but also an ambient light signal; and in the second time period in which none of the light source regions of the display panel are lighted up, the second optical signal collected by the photoelectric sensing module includes only the ambient light signal, and the first optical signal collected by the photoelectric sensor module is corrected based on the second optical signal collected by the photoelectric sensing module, thereby eliminating an influence of the ambient light on the collected fingerprint image, and improving the signal-to-noise ratio.

Further, by reducing the lighting frequency of the light source region of the display panel, the photoelectric sensor has sufficient time to collect images twice respectively in the first time period and the second time period.

Further, since the ambient light hardly changes during one collection period, by using the second optical signal collected by the photoelectric sensing module in the same collection period to correct the first optical signal, it is ensured that the second optical signal is infinitely close to the ambient light actually contained in the first optical signal, thereby ensuring the effectiveness of the correction of the first optical signal, and improving the signal-to-noise ratio and accuracy of the collected fingerprint image.

DETAILED DESCRIPTION

The above described objects, features, and advantages of the present disclosure will become more apparent from the detailed description of the embodiments. The embodiments in the present disclosure are described in a progressive way, and each embodiment lays emphasis on differences from other embodiments. For the same or similar parts between various embodiments, one may refer to the description of other embodiments.

Figure 1:
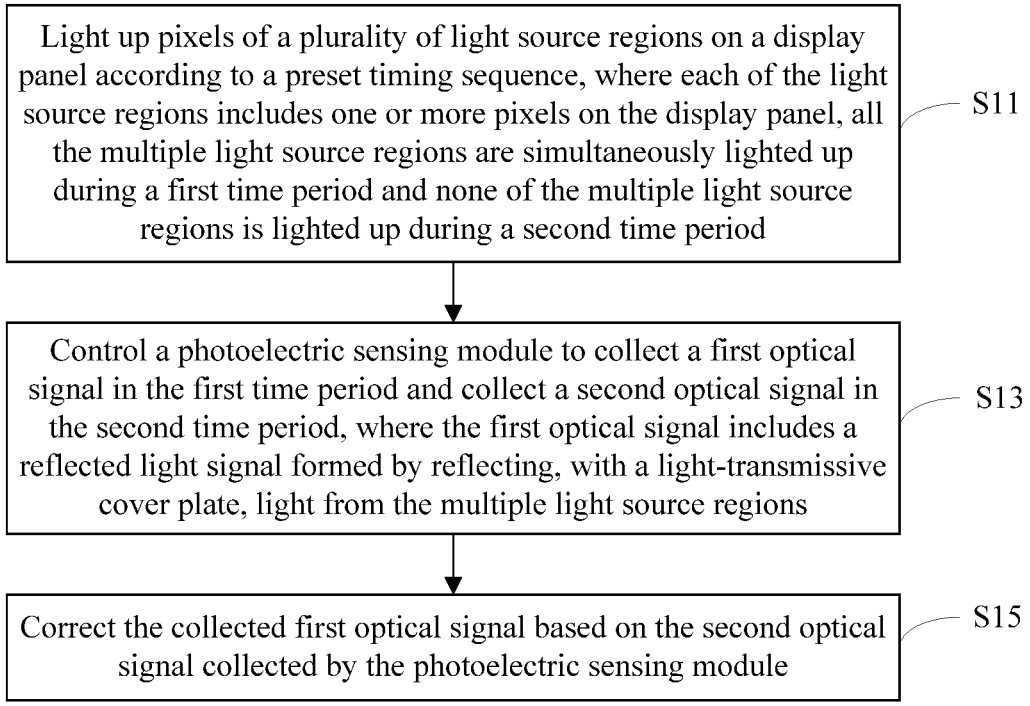
FIG. 1 is a flow chart of a method for fingerprint collection according to an embodiment of the present disclosure.
Figure 2:
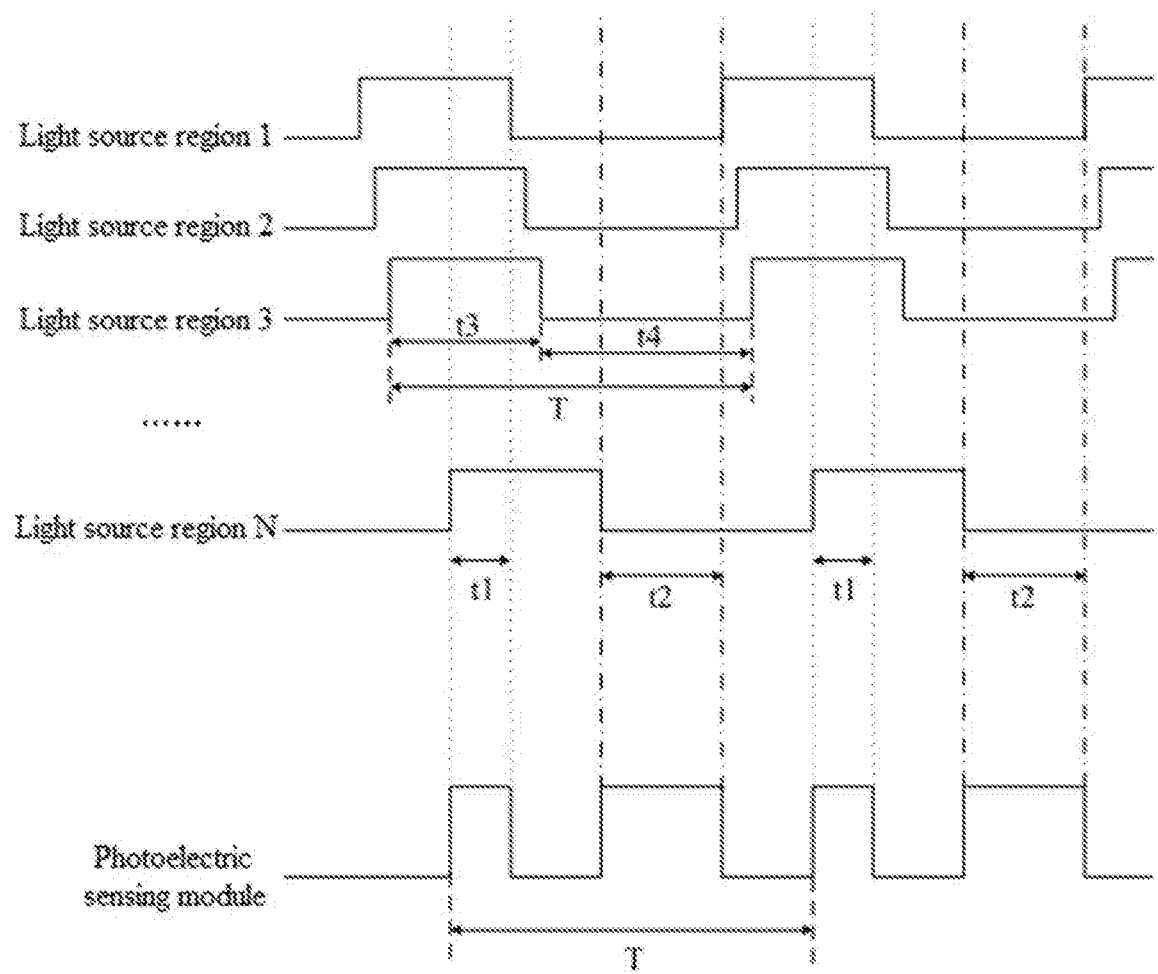
FIG. 2 is a timing sequence diagram of a method for fingerprint collection according to an embodiment of the present disclosure.

Reference is made to FIG. 1 and FIG. 2. FIG. 1 is a flowchart of a method for fingerprint collection according to an embodiment of the present disclosure, and FIG. 2 is a timing sequence diagram of the method for fingerprint collection according to an embodiment of the present disclosure. In some embodiments, the method for fingerprint collection may include the following steps S11, S13 and S15.

In step S11, pixels of a plurality of light source regions 1 to N on a display panel are lighted up according to a preset timing sequence, where each light source region includes one or more pixels on the display panel, all the plurality of light source regions are simultaneously lighted up during a first time period t1 and none of the plurality of light source regions is lighted up during a second time period t2.

In some embodiments, lighting up the pixels of the plurality of light source regions on the display panel according to the preset timing sequence includes: periodically lighting up pixels of each light source region according to the preset timing sequence, where a time interval between two adjacent lighting time instants of each light source region is a lighting period T, and the lighting period of each light source region includes a third time period t3 in which the light source region emits light and a fourth time period t4 in which the light source region does not emit light.

As shown in FIG. 2, the plurality of light source regions 1 to N are sequentially lighted up according to the preset timing sequence, and there is an overlap between light-emitting time periods (i.e., the third time period t3) of every two successively lighted light source regions. In an embodiment of the present disclosure, the third time periods t3 of the plurality of light source regions 1 to N have a common intersection (i.e., an overlapping time period), namely, the first time period t1. During the first time period t1, all light source regions of the display panel emit light. Similarly, there is also an overlap in the timing sequence between non-light-emitting time periods (i.e., the fourth time period t4) of every two successively lighted light source regions. In an embodiment of the present disclosure, the fourth time periods t4 of the plurality of light source regions 1 to N also have a common intersection, namely, the second time period t2. During the second time period t2, no light source regions of the display panel emit light. The third time period t3 of the lighting period of each light source region includes the first time period t1, and the fourth time period t4 of the lighting period of each light source region includes the second time period t2.

In some embodiments, before lighting up the pixels of the plurality of light source regions of the display panel, the method further includes: assigning values to a matrix having a same resolution as the display panel, where non-zero values are assigned to the light source regions and zeros are assigned to other regions; generating a display image according to the matrix assigned with the values as RGB information; and sending the display image to the display panel.

In some embodiments, the arrangement of the plurality of light source regions on the display panel may have a certain topology, and the topology may include a single point arrangement, a multi-point arrangement, a linear arrangement, a parallel arrangement, a ring arrangement, a dashed arrangement, a parallel-dashed arrangement, and the like. The light source region may be circular, rectangular, rhombic, triangular, linear, parallel-shaped, dashed-shaped, parallel-dashed-shaped, or the like.

In some embodiments, in each lighting period T of the light source region, the first time period t1 may account for 10% to 90% of the third time period t3, and the second time period t2 may account for 10% to 90% of the fourth time period t4. The duration of the first time period t1 may be not equal to the duration of the second time period t2.

In some embodiments, the ratio of the third period t3 to the fourth period t4 of each lighting period T of the light source region, namely, the ratio of the light-emitting time period to the non-light-emitting time period of each light source region ranges from 1:1 to 5:1.

In some embodiments, the lighting frequency of each light source region may range from 10 Hz to 60 Hz.

In step S13, a photoelectric sensing module is controlled to collect a first optical signal in the first time period t1 and collect a second optical signal in the second time period t2, where the first optical signal includes a reflected light signal formed by reflecting, with a light-transmissive cover plate, light from the plurality of light source regions. The display panel and the photoelectric sensing module are disposed at a same side of the light-transmissive cover plate. In some embodiment, the light-transmissive cover plate is non-opaque.

In some embodiments, the method for fingerprint collection includes: controlling the photoelectric sensing module to collect the first optical signal in the first time period t1 of each lighting period T of the light source region and collect the second optical signal in the second time period t2 of each lighting period of the light source region.

In some embodiments, the first optical signal includes a totally reflected optical signal formed by reflecting, with the light-transmissive cover plate, a light signal from pixels of the plurality of light source regions. Because when an incident angle of the light emitted by the pixel of the display panel on an upper surface of the light-transmissive cover plate is less than a critical angle of total reflection, most light will pass through the light-transmissive cover plate by refracting, and no significant reflected light is detected on the photoelectric sensing module, for example, a photoelectric sensor.

Over the first time period t1 of each lighting period T of the light source region, all the pixels of the plurality of light source regions on the display panel are simultaneously lighted up, and thus light signals from the pixels of the plurality of light source regions can light up multiple regions on the light-transmissive cover plate, and then the light (hereinafter referred to as "signal light S") totally reflected by the upper surface of the light-transmissive cover plate can be received by the photoelectric sensor, thereby collecting fingerprint images of multiple regions and improving efficiency of image collection. In order to avoid the overlap between the fingerprint images of the multiple regions, the spacing between the two adjacent light source regions satisfies the condition that the total reflection images of the light sources collected by the light sensor are neither overlapped nor duplicate.

In some embodiments, each source light region includes multiple pixels, to meet an illuminance requirement of the imaging.

When the fingerprint is collected in a non-dark environment, not only the signal light S but also the ambient light N (such as sunlight, houselights) will enter the photoelectric sensor and get absorbed by the photoelectric sensor. In this case, the first optical signal collected by the photoelectric sensor includes the signal light S and the ambient light N (i.e., S+N). Especially in some cases that the ambient light N is strong, the ambient light in the first optical signal collected by the photoelectric sensor is relatively large, which greatly reduces the signal-to-noise ratio of the collected fingerprint image.

In the second time period t2, since none of the pixels of the plurality of light source regions of the display panel is lighted up, only the ambient light N can enter the photoelectric sensor and get absorbed by the photoelectric sensor.

In some embodiments, each light source region of the display panel may be lighted up at a frequency of 20 Hz, and a time period during which the photoelectric sensing module collects the first optical signal may be 20 ms, as is the case for the second optical signal. The photoelectric sensing module can complete the collection of all pixel data within 20 ms.

It should be noted that the lighting frequency of the pixels of the display panel of the embodiment of the present disclosure cannot be too high. For example, if the lighting frequency of each pixel is 200 Hz, a time period allowed for image collection by the photoelectric sensing module within each lighting period of the pixel is no longer than 2.5 ms, and it is difficult for the photoelectric sensing module to complete collection of the entire image. In an existing method for fingerprint collection, if the lighting frequency of the pixel of the display panel is too high, the time period for image collection by the photoelectric sensor is much larger than the lighting period of each pixel, in which case the photoelectric sensor needs to continuously collect optical signals in multiple lighting periods of the pixel and average the collected optical signals, thereby failing to realize collection of the first optical signal and the second optical signal in one lighting period of the pixel in the present disclosure.

In some embodiments, controlling the photoelectric sensing module to collect the first optical signal in the first time period t1 and collect the second optical signal in the second time period t2 may include controlling the photoelectric sensing module to collect in the first time period t1 the first optical signal sensed by all photosensitive pixels in the photoelectric sensing module, and controlling the photoelectric sensing module to collect in the second time period t2 the second optical signal sensed by all the photosensitive pixels in the photoelectric sensing module.

In other embodiments, the photoelectric sensing module may also be controlled to collect in the first time period t1 the first optical signal sensed by some but not all of the photosensitive pixels of the photoelectric sensing module, and collect in the second time period t2 the second optical signal sensed by some but not all of the photosensitive pixels of the photoelectric sensing module.

It should be noted that the timing sequence of collection by the photoelectric sensor shown in FIG. 2 is not specifically a driving signal inputted into a certain photosensitive pixel, but schematically illustrates a correspondence relationship between the entire time period for completing image collection by the photoelectric sensor and the lighting timing sequence of the plurality of light source regions of the display panel.

In step S15, the first optical signal collected by the photoelectric sensing module is corrected based on the second optical signal collected by the photoelectric sensing module.

In some embodiments, the time interval between two adjacent collection time instants of the first optical signal is a collection period T. As shown in FIG. 2, each collection period T at least includes the first time period t1 and the second time period t2. The correcting the first optical signal collected by the photoelectric sensing module based on the second optical signal collected by the photoelectric sensing module includes: correcting the first optical signal collected by the photoelectric sensing module in each collection period T based on the second optical signal collected by the photoelectric sensing module in the same collection period T.

Since the ambient light hardly changes during one collection period, by using the second optical signal collected by the photoelectric sensing module in the same collection period to correct the first optical signal, it is ensured that the second optical signal is infinitely close to the ambient light actually contained in the first optical signal, thereby ensuring the effectiveness of the correction of the first optical signal, and improving the signal-to-noise ratio of the collected fingerprint image and data accuracy. Compared with the solution that the photoelectric sensor collects the ambient light signal once after collecting the optical signals in multiple consecutive pixel lighting periods so as to correct the signal light previously collected, the correction of the signal light in the present disclosure is substantially a real-time correction, which further improves the signal-to-noise ratio and accuracy of the collected fingerprint images.

In some embodiments, the period for collecting the first optical signal by the photoelectric sensing module is equal to the period for collecting the second optical signal by the photoelectric sensing module, and is also equal to the lighting period T of the light source region.

In some embodiments, the correcting the first optical signal collected by the photoelectric sensing module in each collection period based on the second optical signal collected by the photoelectric sensing module in the same collection period includes: subtracting the second optical signal from the first optical signal by a differential method. In an embodiment, a first electrical signal corresponding to the first optical signal and a second electrical signal corresponding to the second optical signal may be obtained, where the first electrical signal and the second electrical signal are detected by the photoelectric sensing module, and the second electrical signal may be subtracted from the first electrical signal, thereby subtracting noise such as ambient light from the first optical signal.

In some embodiments, the method for fingerprint collection further includes: performing positional shifting on the plurality of light source regions after a preset time interval; re-performing the steps of lighting up the pixels of the plurality of light source regions, controlling the photoelectric sensing module to collect the first optical signal and the second optical signal and correcting the first optical signal based on the second optical signal, until a fingerprint image that satisfies the complete fingerprint splicing requirement is acquired. Although there are a plurality of light source regions to illuminate the fingerprint, seamless scanning on the full fingerprint cannot be completed by only one imaging process, especially when the plurality of light source regions on the display panel are sparse. Therefore in order to obtain a complete fingerprint image, time division multiplexing technology is adopted to achieve full fingerprint coverage. For each imaging, the first optical signal collected in each lighting period of the light source region by the photoelectric sensing module may be corrected in a real-time manner by the method for fingerprint collection according to the foregoing embodiments of the present disclosure.

Figure 3:
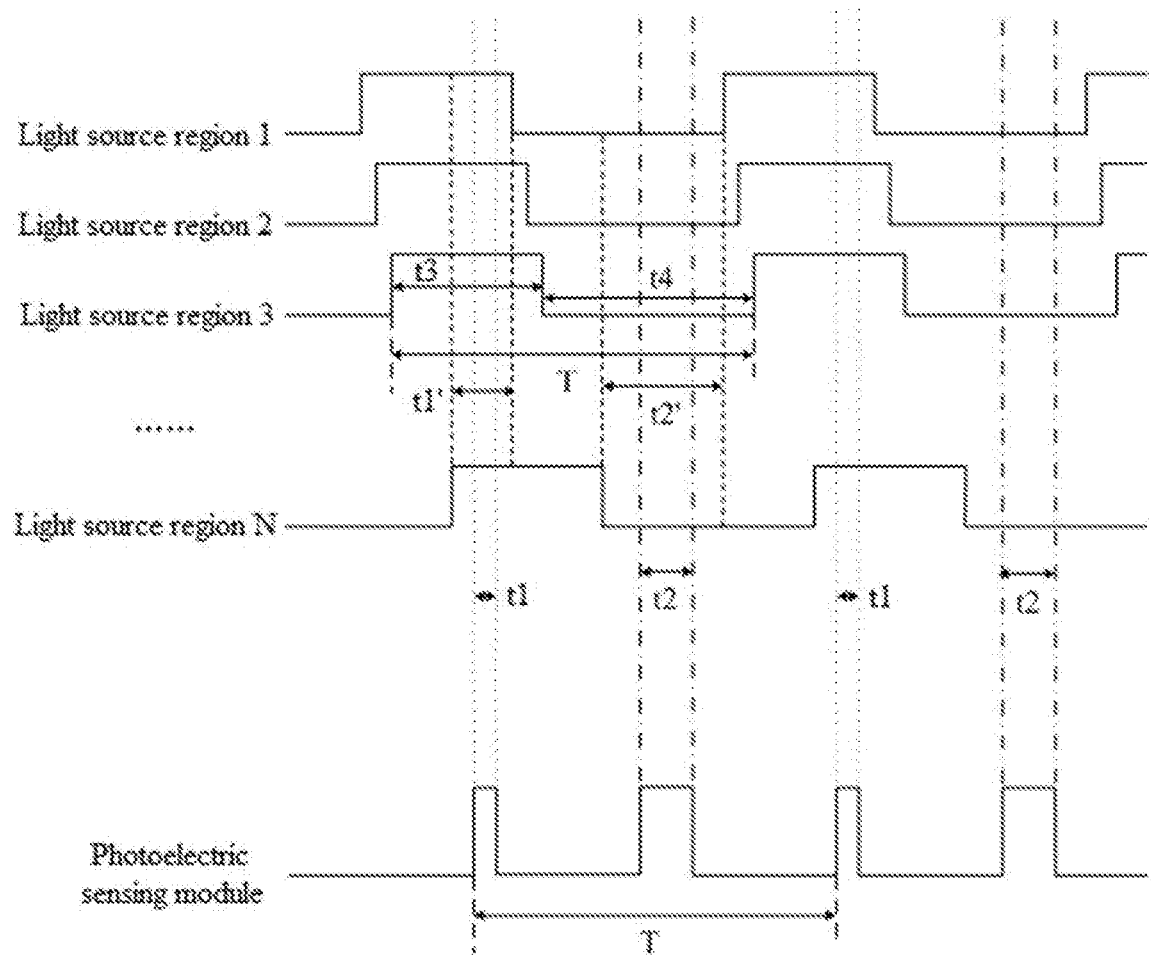
FIG. 3 is a timing sequence diagram of a method for fingerprint collection according to another embodiment of the present disclosure.

Reference is made to FIG. 3. FIG. 3 is a timing sequence diagram of a method for fingerprint collection according to another embodiment of the present disclosure.

The embodiment differs from the foregoing embodiment only in that during each lighting period T of the light source region, the intersection (i.e., the overlapped time period)

between the third time periods t3 of the plurality of light source regions 1 to N is a time period t1', and the intersection between the fourth time periods t4 of the plurality of light source regions 1 to N is a time period t2'. In this case, in the step S13 of the method for fingerprint collection, the photoelectric sensor module is controlled to collect the first optical signal in the first time period t1 and collect the second optical signal in the second time period t2, where t1<t1' and t2<t2'. In an embodiment, the lighting frequency of each light source region may be 10 Hz, t1' may be 30 ms, t2' may be 30 ms, the first time period t1 for collection by the photoelectric sensing module may be 25 ms, and the second time period t2 may be 25 ms.

Figure 4:
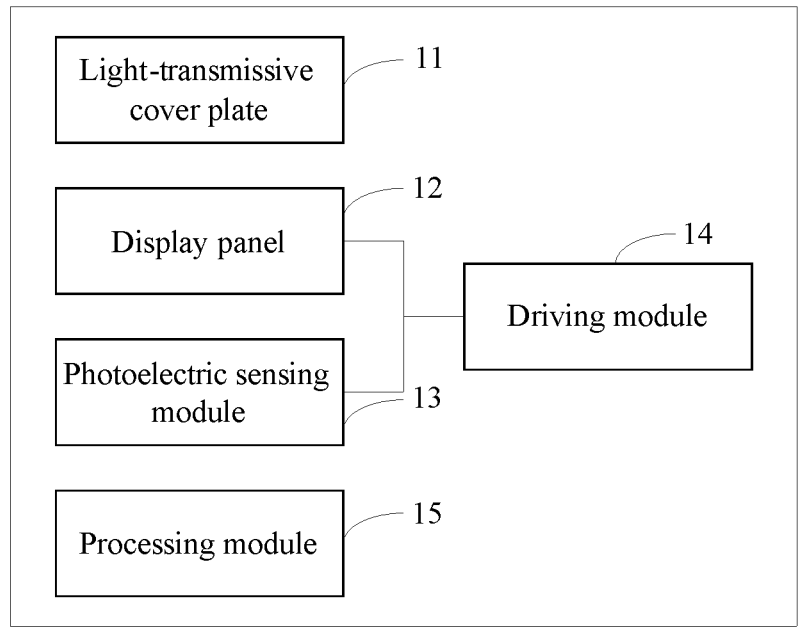
FIG. 4 is a structural block diagram of an apparatus 10 for fingerprint collection according to an embodiment of the present disclosure.
Figure 5:
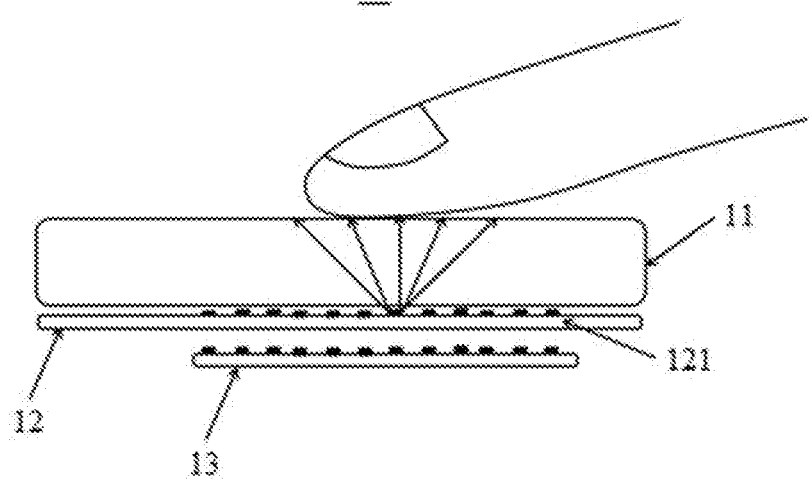
FIG. 5 is a cross-sectional view of an apparatus 10 for fingerprint collection according to an embodiment of the present disclosure.

The present disclosure further provides an apparatus for fingerprint collection. Reference is made to FIG. 4 and FIG. 5. FIG. 4 is a structural block diagram of an apparatus 10 for fingerprint collection according to an embodiment of the present disclosure, and FIG. 5 is a cross-sectional view of the apparatus 10 for fingerprint collection according to an embodiment of the present disclosure.

In some embodiments, the apparatus 10 for fingerprint collection may include: a light-transmissive cover plate 11 having a surface for contact with a fingerprint; a display panel 12 including a pixel array formed by multiple pixels 121; a photoelectric sensing module 13 for receiving and detecting an optical signal; a driving module 14 configured to: light up pixels of the plurality of light source regions on the display panel 12 according to a preset timing sequence, where each light source region includes one or more pixels 121 on the display panel 12, all the plurality of light source regions are simultaneously lighted up during a first time period and none of the plurality of light source regions is lighted up during a second time period; control the photoelectric sensing module 13 to collect a first optical signal in the first time period and collect a second optical signal in the second time period, where the first optical signal includes a reflected light signal formed by reflecting, with the light-transmissive cover plate 11, light from the plurality of light source regions; and a processing module 15, configured to correct the first optical signal collected by the photoelectric sensing module 13 based on the second optical signal collected by the photoelectric sensing module 13, where the display panel 12 and the photoelectric sensing module 13 are disposed at a same side of the light-transmissive cover plate 11. In some embodiment, the light-transmissive cover plate 11 is nonopaque.

In some embodiments, the display panel 12 may be disposed between the photoelectric sensing module 13 and the light-transmissive cover plate 11, and the light from the pixels of the plurality of light source regions on the display panel 12 may enter the photoelectric module 13 through the gaps between the pixels of the display panel 12 after being reflected by the light-transmissive cover plate 11.

In other embodiments, the photoelectric sensing module may be disposed between the light-transmissive cover plate and the display panel, and in this case a photosensitive unit of the photoelectric sensing module may be disposed in the gap between the pixels of the display panel.

In some embodiments, the display panel may be a liquid crystal display, an active array organic light emitting diode display, or a micro light emitting diode display.

In some embodiments, the apparatus 10 for fingerprint collection may be a under-screen optical fingerprint collection apparatus based on the principle of total optical reflection of physical optics, where the pixels 121 are configured to emit light signals in different directions facing a surface of the light-transmissive cover plate 11, and the light signals are reflected on an upper surface of the light-transmissive cover plate 11 to form reflected light in different directions. An incident angle of the light signal on the upper surface of the light-transmissive cover plate 11 is less than a critical angle of total reflection, and most of the light signals are transmitted through the light-transmissive cover plate 11 by refracting, as a result of which no significant reflected light is detected by the photoelectric sensing module 13. When the incident angle on the upper surface of the light-transmissive cover plate 11 is equal to or greater than the critical angle of the total reflection, the light is totally reflected by the light-transmissive cover plate 11 and transmitted to the photoelectric sensing module 13 through the display panel 12, so that totally reflected light with a large light intensity can be detected by the photoelectric sensing module 13. The fingerprint image detected through such totally reflected light can be used as valid fingerprint data. The first optical signal may include totally reflected light signals formed by totally reflecting, with the light-transmissive cover plate 11, the light from the plurality of light source regions.

The functions of the driving module 14 and the processing module 15 of the apparatus 10 for fingerprint collection of the embodiment of the present disclosure are described hereinafter, for better understanding of which reference may be made to related descriptions of the method for fingerprint collection according to the embodiments as shown in FIGS. 1 to 3.

In some embodiments, the driving module 14 is configured to periodically light up pixels of each light source region according to the preset timing sequence, where a time interval between two adjacent lighting time instants of each light source region is a lighting period, the lighting period of each light source region includes a third time period in which the light source region emits light and a fourth time period in which the light source region does not emit light, the third time period includes the first time period, and the fourth time period includes the second time period.

The driving module 14 is further configured to control the photoelectric sensing module 13 to collect the first optical signal in the first time period of each lighting period of the light source region and collect the second optical signal in the second time period of each lighting period of the light source region. The period in which the photoelectric sensing module 13 collects the first optical signal may be equal to the period in which the photoelectric sensing module 13 collects the second optical signal, and may be equal to the lighting period of the light source region of the display panel 12.

In some embodiments, the first time period may account for 10% to 90% of the third time period, and the second time period may account for 10% to 90% of the fourth time period.

In some embodiments, the ratio of the third time period to the fourth time period ranges from 1:1 to 5:1.

In some embodiments, the lighting frequency of the light source region may range from 10 Hz to 60 Hz, and a time period for collecting either the first optical signal or the second optical signal by the photoelectric sensing module 13 may range from 5 ms to 45 ms.

In some embodiments, a time interval between two adjacent collection time instants of the first optical signal by the photoelectric sensing module 13 is a collection period, and each collection period at least includes the first time period and the second time period. The processing module 15 is configured to correct the first optical signal collected by the photoelectric sensing module 13 in each collection period based on the second optical signal collected by the photoelectric sensing module 13 in the same collection period.

In some embodiments, the processing module 15 is configured to subtract the second optical signal from the first optical signal by a differential method. In an embodiment, the processing module 15 is configured to obtain a first electrical signal, which is detected by the photoelectric sensing module 13, corresponding to the first optical signal and a second electrical signal, which is detected by the photoelectric sensing module 13, corresponding to the second optical signal, and subtract the second electrical signal from the first electrical signal, so as to remove the ambient light from the first optical signal.

In some embodiments, the driving module 14 is further adapted to: perform positional shifting on the plurality of light source regions after a preset time interval; re-perform the steps of lighting up the pixels of the plurality of light source regions and controlling the photoelectric sensing module 13 to collect the first optical signal and the second optical signal; and the processing module 15 is further configured to correct the first optical signal collected by the photoelectric sensing module 13 based on the second optical signal collected by the photoelectric sensing module 13 after positions of the plurality of light source regions are shifted.

In some embodiments, the driving module 14 may include: a scan line driving circuit and a data line driving circuit of the display pixels 121 of the display panel 12; and a scan line driving circuit and a data line drive circuit of the photosensitive pixel of the photoelectric sensing module 13.

Reference can be made to the relevant parts of the method for fingerprint collection of the foregoing FIG. 1 to FIG. 3 for other functions of the driving module 14 and the processing module 15, which are not described herein.

It should be noted that the method and apparatus for fingerprint collection according to the embodiments of the present disclosure can greatly weaken or even eliminate the influence of ambient light. In addition to the ambient light, the light from the light source (i.e., the pixel 121) is also directly projected onto the photoelectric sensor 13 to form a bright spot in the collected fingerprint image, but such light does not constitute a noise signal for the fingerprint image collected by the method and apparatus for fingerprint collection according to the embodiments of the present disclosure, because in the under-screen optical fingerprint recognition technology based on the principle of total reflection imaging of physical optics, effective fingerprint data is collected only from a region outside a circle which is centered at a point light source and has a radius of a specific length, and the bright spot at the center of the circle generated by the light source does not have a large influence on fingerprint data collected from outside the circle. The radius of the circle is related to the distance between the pixel 121 and the upper surface of the light-transmissive cover plate 11 and the critical angle of total reflection of the light from the pixel 121 on the upper surface of the light-transmissive cover plate 11.

In some embodiments, an area of the bright spot generated by the point source (i.e., the pixel 121) being projected on the photoelectric sensing module 13 can be reduced by reducing the distance between the pixel 121 of the display panel 12 and the photoelectric sensing module 13 as much as possible, thereby weakening or even eliminating the background signal generated by the light from the pixel 121 on the collected fingerprint image.

Figure 6:
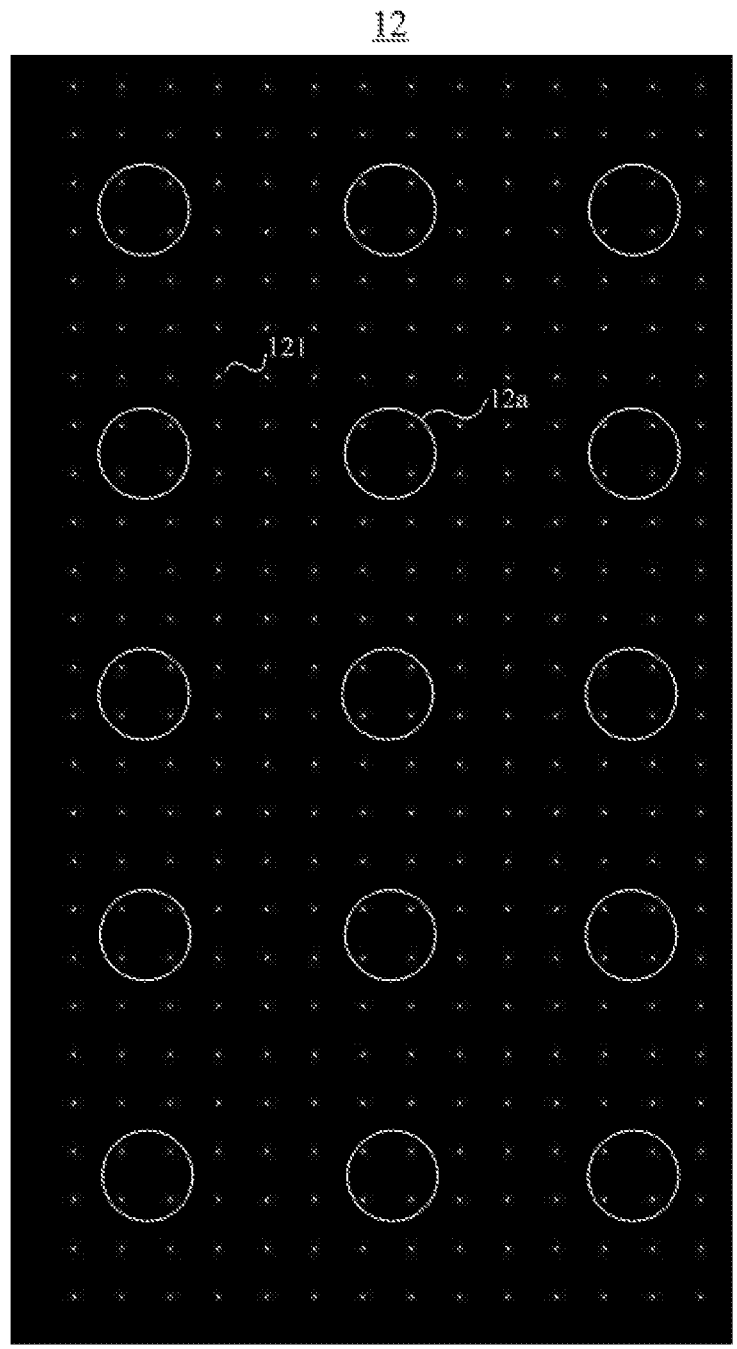
FIG. 6 is a schematic diagram showing the distribution of a plurality of light source regions 12a of a display panel 12 according to an embodiment of the present disclosure.

Reference is made to FIG. 6. FIG. 6 is a schematic diagram of a plurality of light source regions on the display panel 12 according to an embodiment of the present disclosure.

In some embodiments, the display panel 12 may be provided with a plurality of discrete light source regions 12a, and each of the light source regions 12a may include multiple pixels 121. The arrangement of the plurality of light source regions 12a on the display panel 12 may have a certain topology, and the topology may include a single point arrangement, a multi-point arrangement, a linear arrangement, a parallel arrangement, a ring arrangement, a dashed arrangement, a parallel-dashed arrangement, and the like. The light source region 12a may be circular, rectangular, rhombic, triangular, linear, parallel-shaped, dashed-shaped, parallel-dashed-shaped, or the like. The plurality of light source regions 12a shown in FIG. 6 are evenly arranged, that is, the distance between each two adjacent light source regions 12a is the same, which facilitates subsequent image processing.

In summary, according to the method and apparatus for fingerprint collection of the present disclosure, the first optical signal is collected by the photoelectric sensing module in the first time period in which all the light source regions of the display panel are lighted up. The first optical signal includes both the reflected light signal, which is formed by reflecting, with the light-transmissive cover plate, the light from the plurality of light source regions, and the ambient light signal. In the second time period in which none of the light source regions of the display panel is lighted up, the second optical signal collected by the photoelectric sensing module includes only the ambient light signal. The first optical signal collected by the photoelectric sensor module is corrected based on the second optical signal collected by the photoelectric sensing module, to eliminate the influence of the ambient light on the collected fingerprint image, thereby improving the signal-to-noise ratio.

Further, by reducing the lighting frequency of the light source region of the display panel, the photoelectric sensor has sufficient time to complete the collection of images twice respectively in the first time period and the second time period.

Further, since the ambient light hardly changes during the same collection period, by using the second optical signal collected by the photoelectric sensing module to correct the first optical signal collected by the photoelectric sensing module in the same collection period, it is ensured that the second optical signal is infinitely close to the ambient light actually contained in the first optical signal, thereby ensuring the effectiveness of the correction of the first optical signal, and improving the signal-to-noise ratio and accuracy of the collected fingerprint image.

The invention is not limited to the embodiments as disclosed above. Any changes and modifications may be made by those skilled in the art without departing from the spirit and scope of the present disclosure, and therefore the scope of the present disclosure is best defined by the appended claims.

The invention claimed is:

1. A method for fingerprint collection, comprising:
    lighting up pixels of a plurality of light source regions on a display panel according to a preset timing sequence, wherein each of the light source regions comprises one or more pixels on the display panel, all the plurality of light source regions are simultaneously lighted up during a first time period and none of the plurality of light source regions is lighted up during a second time period;
    controlling a photoelectric sensing module to collect a first optical signal in the first time period and collect a second optical signal in the second time period, wherein the first optical signal comprises a reflected light signal formed by reflecting, with a light-transmissive cover plate, light from the plurality of light source regions; and correcting the collected first optical signal based on the second optical signal collected by the photoelectric sensing module, wherein the display panel and the photoelectric sensing module are disposed at a same side of the light-transmissive cover plate;

wherein correcting the collected first optical signal based on the second optical signal collected by the photoelectric sensing module comprises subtracting the second optical signal from the first optical signal by a differential method;

wherein subtracting the second optical signal from the first optical signal by the differential method comprises obtaining a first electrical signal corresponding to the first optical signal and a second electrical signal corresponding to the second optical signal by the photoelectric sensing module and subtracting the second electrical signal from the first electrical signal.

2. The method for fingerprint collection according to claim 1, wherein lighting up the pixels of the plurality of light source regions on the display panel according to the preset timing sequence comprises:

periodically lighting up pixels of each light source region according to the preset timing sequence, wherein a time interval between two adjacent lighting time instants of each light source region is a lighting period, the lighting period of each light source region comprises a third time period in which the light source region emits light and a fourth time period in which the light source region does not emit light, the third time period comprises the first time period, and the fourth time period comprises the second time period.

3. The method for fingerprint collection according to claim 2, wherein controlling the photoelectric sensing module to collect the first optical signal in the first time period and collect the second optical signal in the second time period comprises:

controlling the photoelectric sensing module to collect the first optical signal in the first time period of each lighting period of the light source region and collect the second optical signal in the second time period of each lighting period of the light source region.

4. The method for fingerprint collection according to claim 3, wherein a time interval between two adjacent collection time instants of the first optical signal by the photoelectric sensing module is a collection period, each collection period at least comprises the first time period and the second time period, and correcting the collected first optical signal based on the second optical signal collected by the photoelectric sensing module comprises:

correcting the first optical signal collected by the photoelectric sensing module in each collection period based on the second optical signal collected by the photoelectric sensing module in the same collection period.

5. The method for fingerprint collection according to claim 4, wherein the collection period of the photoelectric sensing module is equal to the lighting period of the light source region.

6. The method for fingerprint collection according to claim 2, wherein the first time period accounts for 10% to 90% of the third time period, and the second time period accounts for 10% to 90% of the fourth time period.

7. The method for fingerprint collection according to claim 2, wherein the ratio of the third time period to the fourth time period ranges from 1:1 to 5:1.

8. The method for fingerprint collection according to claim 1, wherein a lighting frequency of the light source region ranges from 10 Hz to 60 Hz.

9. The method for fingerprint collection according to claim 1, wherein the first time period and the second time period both range from 5 ms to 45 ms.

10. The method for fingerprint collection according to claim 1, further comprising:

performing positional shifting on the plurality of light source regions after a preset time interval; and re-performing the steps of lighting up the pixels of the plurality of light source regions, controlling the photoelectric sensing module to collect the first optical signal and the second optical signal and correcting the first optical signal based on the second optical signal.

11. An apparatus for fingerprint collection, comprising:

a light-transmissive cover plate having a surface for contact with a fingerprint;

a display panel comprising a pixel array;

a photoelectric sensing module configured to receive and detect an optical signal;

a driving module, configured to:

light up pixels of a plurality of light source regions on the display panel according to a preset timing sequence, wherein each light source region comprising one or more pixels on the display panel, all the plurality of light source region is simultaneously lighted up during a first time period and none of the plurality of light source regions is lighted up during a second time period; and control the photoelectric sensing module to collect a first optical signal in the first time period and collect a second optical signal in the second time period, the first optical signal comprising a reflected light signal formed by reflecting, with the light-transmissive cover plate, light from the plurality of light source regions; and a processing module, configured to correct the collected first optical signal based on the second optical signal collected by the photoelectric sensing module, wherein the display panel and the photoelectric sensing module are disposed at a same side of the light-transmissive cover plate;

wherein the processing module is configured to subtract the second optical signal from the first optical signal by a differential method, wherein the processing module is configured to obtain a first electrical signal corresponding to the first optical signal and a second electrical signal corresponding to the second optical signal by the photoelectric sensing module, and subtract the second electrical signal from the first electrical signal.

12. The apparatus for fingerprint collection according to claim 11, wherein the driving module is configured to:

periodically light up pixels of each light source region according to the preset timing sequence, wherein a time interval between two adjacent lighting time instants of each light source region is a lighting period, the lighting period of each light source region comprises a third time period in which the light source region emits light and a fourth time period in which the light source region does not emit light, the third time period comprises the first time period, and the fourth time period comprises the second time period.

13. The apparatus for fingerprint collection according to claim 12, wherein the driving module is configured to:
control the photoelectric sensing module to collect the first optical signal in the first time period of each lighting period of the light source region and collect the second optical signal in the second time period of each lighting period of the light source region.

14. The apparatus for fingerprint collection according to claim 13, wherein a time interval between two adjacent collection time instants of the first optical signal by the photoelectric sensing module is a collection period, each collection period at least comprises the first time period and the second time period, and the processing module is configured to:
correct the first optical signal collected by the photoelectric sensing module in each collection period based on the second optical signal collected by the photoelectric sensing module in the same collection cycle.

15. The apparatus for fingerprint collection according to claim 14, wherein the collection period of the photoelectric sensing module is equal to the lighting period of the light source region.

16. The apparatus for fingerprint collection according to claim 12, wherein the first time period accounts for 10% to 90% of the third time period, and the second time period accounts for 10% to 90% of the fourth time period.

17. The apparatus for fingerprint collection according to claim 12, wherein the ratio of the third time period to the fourth time period ranges from 1:1 to 5:1.

18. The apparatus for fingerprint collection according to claim 11, wherein a lighting frequency of the light source region ranges from 10 Hz to 60 Hz.

19. The apparatus for fingerprint collection according to claim 11, wherein the first time period and the second time period both range from 5 ms to 45 ms.

20. The apparatus for fingerprint collection according to claim 11, wherein the driving module is further configured to:
perform positional shifting on the plurality of light source regions after a preset time interval, and re-perform the steps of lighting up the pixels of the plurality of light source regions and controlling the photoelectric sensing module to collect the first optical signal and the second optical signal; and
the processing module is further configured to:
correct the first optical signal collected by the photoelectric sensing module based on the second optical signal collected by the photoelectric sensing module after positions of the plurality of light source regions are shifted.

* * * * *